United States Patent [19]

Korbonski

[11] Patent Number: 5,067,859
[45] Date of Patent: Nov. 26, 1991

[54] METHOD FOR DRILLING SMALL HOLES IN PRINTED CIRCUIT BOARDS

[75] Inventor: John A. Korbonski, San Juan Capistrano, Calif.

[73] Assignee: Systems Division Incorporated, San Juan Capistrano, Calif.

[21] Appl. No.: 480,748

[22] Filed: Feb. 15, 1990

[51] Int. Cl.⁵ .......................... B23B 35/00; B23B 41/14
[52] U.S. Cl. ...................................... 408/1 R; 408/95
[58] Field of Search ...................... 408/1 R, 87, 95, 97

[56] References Cited

U.S. PATENT DOCUMENTS

| 483,903 | 10/1892 | Coxe et al. . | |
|---|---|---|---|
| 1,660,372 | 2/1928 | Bockhoff . | |
| 1,714,564 | 5/1929 | Koehler . | |
| 2,084,427 | 6/1937 | Broderson | 18/47.5 |
| 2,128,087 | 8/1938 | Gatke | 308/238 |
| 2,233,206 | 2/1941 | Frederick | 154/52 |
| 2,250,845 | 7/1941 | Stefano | 77/62 |
| 2,267,336 | 12/1941 | Kindelberger | 77/6 |
| 2,285,911 | 6/1942 | De Hart | 77/22 |
| 2,417,539 | 3/1947 | Aronson | 77/62 |
| 2,428,201 | 9/1947 | Cannarili et al. | 77/62 |
| 2,479,293 | 8/1949 | Bayless | 77/5 |
| 2,510,203 | 6/1950 | Andreasson | 77/55 |
| 2,575,378 | 11/1951 | Bender | 164/58 |
| 2,589,582 | 3/1952 | Strughold et al. | 252/12 |
| 2,625,846 | 6/1953 | Hess | 77/64 |
| 2,686,155 | 8/1954 | Willis et al. | 252/12 |
| 2,847,880 | 8/1958 | Neidig | 77/55 |
| 3,026,749 | 3/1962 | Miller et al. | 77/62 |
| 3,098,401 | 7/1963 | Breeze, Jr. et al. | 77/62 |
| 3,116,652 | 1/1964 | Bregnard | 77/5 |
| 3,120,136 | 2/1964 | Bieker . | |
| 3,145,589 | 8/1964 | Jonker | 77/62 |
| 3,190,842 | 6/1965 | Ringwood et al. | 260/2.5 |
| 3,359,583 | 12/1967 | Strube | 10/139 |
| 3,369,293 | 2/1968 | Tillotson | 29/625 |

(List continued on next page.)

FOREIGN PATENT DOCUMENTS

| 0208567 | 4/1984 | Fed. Rep. of Germany | 3/51 |
|---|---|---|---|
| 0100059 | 6/1982 | Japan . | |
| 0110510 | 6/1984 | Japan . | |
| 0155307 | 8/1985 | Japan . | |
| 0136705 | 6/1986 | Japan . | |
| 2019305 | 1/1987 | Japan . | |
| 2188695 | 8/1987 | Japan . | |
| 0264812 | 11/1987 | Japan . | |
| 0271612 | 11/1987 | Japan . | |
| 0044486 | 9/1988 | Japan . | |
| 0251107 | 10/1988 | Japan . | |
| 20908 | 1/1989 | Japan | 408/1 R |
| 0064708 | 3/1989 | Japan . | |
| 148323 | of 1962 | U.S.S.R. . | |
| 0686832 | 10/1979 | U.S.S.R. . | |
| 1177074 | 9/1985 | U.S.S.R. . | |
| 213145 | 3/1924 | United Kingdom . | |
| 1279841 | 6/1972 | United Kingdom . | |
| 2074059 | 10/1981 | United Kingdom . | |
| 2074060 | 10/1981 | United Kingdom . | |

OTHER PUBLICATIONS

"A Guide to Cutting and Maching Kevlar Aramid," Kevlar Special Products, E. I. du Pont De Nemours & Co. (Inc.), Wilmington, Del. 19898.
"High Temperature Lubricants," Feb. 1951, Chemical Engineering.

Primary Examiner—Steven C. Bishop
Attorney, Agent, or Firm—Roberts and Quiogue

[57] ABSTRACT

A method for drilling very small diameter holes (0.005 inches or smaller) in a printed circuit board is described, employing an entry overlay sheet. The entry overlay sheet is a thin layer of a homogenous polymer material, having a thickness of 0.005 to 0.010 inches, but at least 1.5 times the drill diameter. To provide improved drilling characteristics the polymer may be filled with mineral filler particles such as talcum powder. The method of drilling the printed circuit board includes (i) placing a sheet of this entry material on top of the printed circuit board, and (ii) drilling through the entry material and printed circuit board in succession.

16 Claims, 2 Drawing Sheets

U.S. PATENT DOCUMENTS

| | | | |
|---|---|---|---|
| 3,637,317 | 1/1972 | Pomeroy et al. | 408/1 |
| 3,663,114 | 5/1972 | Welsh et al. | 408/3 |
| 3,700,341 | 10/1972 | Block | 408/1 R |
| 3,718,404 | 2/1973 | Grinnell et al. | 408/46 |
| 3,719,113 | 3/1973 | Gerber et al. | 83/56 |
| 3,730,634 | 5/1973 | Gerber et al. | 408/22 |
| 3,851,990 | 12/1974 | West | 408/1 |
| 3,873,458 | 3/1975 | Parkinson | 252/49.5 |
| 3,894,956 | 7/1975 | Whitt | 252/14 |
| 4,019,826 | 4/1977 | Block | 408/1 R |
| 4,056,478 | 11/1977 | Capelli | 252/12.4 |
| 4,140,834 | 2/1979 | Marcantonio et al. | 428/419 |
| 4,261,285 | 4/1981 | Pearl | 118/37 |
| 4,280,775 | 7/1981 | Wood | 408/3 |
| 4,311,419 | 1/1982 | Block | 408/1 R |
| 4,419,803 | 12/1983 | Thronton et al. | 29/428 |
| 4,596,500 | 6/1986 | Raiteri | 408/3 |
| 4,605,344 | 8/1986 | Hartmann | 408/95 |
| 4,619,345 | 10/1986 | Rands | 184/109 |
| 4,740,117 | 4/1988 | Schaff Deleury et al. | 408/72 R |
| 4,781,495 | 11/1988 | Hatch et al. | 408/1 R |
| 4,808,046 | 2/1989 | Pilkington et al. | 409/132 |

METHOD FOR DRILLING SMALL HOLES IN PRINTED CIRCUIT BOARDS

BACKGROUND OF THE INVENTION

This invention relates to the fabrication of printed circuit boards, and more specifically to a method for drilling small holes in printed circuit boards employing an improved entry overlay sheet.

In the process of manufacturing printed circuit boards used in the electronics industry, many holes of various sizes have to be drilled through these boards to accommodate component leads or to be used as interconnections between different layers of the printed circuit board. Currently, the existing process of drilling holes in printed circuit boards utilizes an entry material sheet of either aluminum, e.g., as described in U.S. Pat. No. 4,019,826, or a laminate sheet having a core of cellulose and/or unwoven glass fiber laminated on both sides with aluminum as the entry material. For example, U.S. Pat. No. 4,311,419 describes an entry material comprising a wood pulp-glass composite substrate having aluminum foil bonded to the opposite surfaces thereof.

In the fabrication of a new generation of printed circuit boards requiring very small holes of diameter 0.005 inches and smaller, the drilling of such very small holes is now a major difficulty. Specifically, due to the very small hole diameter and consequently the very small drill diameter used to drill those holes, the entry material becomes a very critical item enabling successful drilling operations. Due to the fragile nature of the small drill, where the drill diameter is less than 0.005 inches, conventional entry materials cannot be used effectively to guide the drill accurately in the drilled substrate.

Conventional entry materials have several disadvantages. Aluminum is not an easily drilled medium and small drills will frequently break upon contact. The drill is made of tungsten carbide and is very brittle; hence, bending of the drill in the process of penetrating the entry material may result in breakage of the drill. The drilled hole positioning is of great importance in the fabrication of many printed circuit boards, and any irregularities in the entry material may cause deflection of the fine drill away from the true direction, therefore decreasing the drilled hole positioning accuracy. The mixture of cellulose or unwoven fiberglass with various resins in some conventional entry materials is not homogenous when viewed under a microscope. This inhomogeneity tends to deflect the small diameter drills. This deflection can be sufficient to affect the positioning of the drilled hole and often break the drill.

SUMMARY OF THE INVENTION

The present invention overcomes the aforementioned disadvantages through a homogenous entry material that requires a lower drilling torque and imposes a lower compressive load on the drill at the moment of contact with the entry layer. According to the present invention an improved entry overlay sheet is provided for drilling very small holes in printed circuit boards with a drill diameter equal to or smaller than five thousandths of an inch thick (0.005 inch). The entry overlay sheet is a homogenous layer or film comprising a polymer material, selected from either the families of thermoset or thermoplastic materials. Thermoplastic materials include, for example, cellulose triacetate, polyester, polyimid, polyetherimid, and polycarbonate. Thermoset materials include, for example, films made of thermoset resins. The entry overlay material includes a thin sheet having a typical thickness in the range of about 5 thousandths to 10 thousandth of an inch. The polymer material can be filled to some degree with fill particles no larger than 30 microns in size to provide more desirable machining characteristics for the sheet. The fill particles may comprise, for example, mineral fillers such as talcum powder or other mineral powders. The fill particles are evenly dispersed in the polymer matrix, assuring homogeneity of the finished film.

The method of drilling the printed circuit board in accordance with the invention includes (i) placing an entry overlay sheet as described above on top of the printed circuit board, and (ii) drilling through the entry material and printed circuit board in succession.

The entry overlay sheet provides a homogenous, easily penetrated medium for the drill at the beginning of the drilling cycle. It minimizes loads applied to the drill while penetrating the entry overlay sheet and consequently improves drilling accuracy and minimizes drill breakage. The optimum thickness of the sheet is selected to give the drill a lateral support and guidance at the moment of impacting the hole drilling in the printed circuit board surface.

The entry overlay sheet is sufficiently rigid to avoid lift off from the printed circuit board surface during drilling, and to maintain a good contact with the surface of the printed circuit board when held down by the pressure foot of the drill spindle, preventing formation of a burr on the surface of the printed circuit board and allowing good evacuation of the chip load. The plastic material for the entry overlay sheet has a sufficiently high melting temperature to withstand contact with a hot drill during the drilling process.

BRIEF DESCRIPTION OF THE DRAWINGS

These and other features and advantages of the present invention will become more apparent from the following detailed description of an exemplary embodiment thereof, as illustrated in the accompanying drawings, in which.

DETAILED DESCRIPTION OF THE PREFERRED EMBODIMENT

Figure 1A:
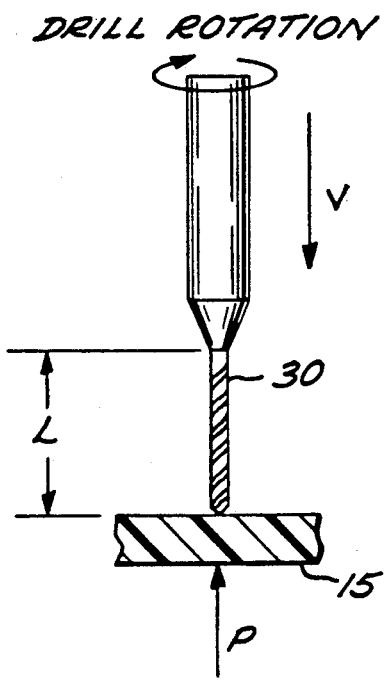
FIG. 1A illustrates the drilling of a printed circuit board in a conventional manner with a very small diameter drill bit.
Figure 1B:
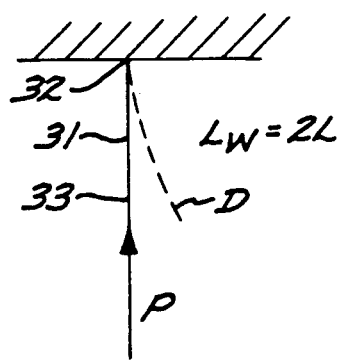
FIG. 1B shows a model of the loading and deflection pattern of the drill bit for this example.

FIGS. 1A and 1B illustrate certain engineering principles at work in the process of drilling with a drill diameter of five mils (0.005 inches) or less. At the beginning of the drilling cycle, the rapidly rotating drill bit 30 is moving at a constant velocity V toward the surface of the printed circuit board 15. At the moment of contact with the board surface, the drill 30 can be modeled as a slender column 31 fixed on one end 32 and instantaneously loaded at the free end 33 with an axial load P (as shown in FIG. 1B) and a torque (the torque load is not shown in FIG. 1A and not considered further). At the time of contact with the hard surface of the printed circuit board, the drill tip is free to deflect laterally and the small diameter drill 30 can bend or deflect in the deflection pattern D shown in FIG. 1A. This is true also of the case where a conventional aluminum or aluminum composite overlay sheet is used, due to the hardness of the aluminum layer.

Figure 2A:
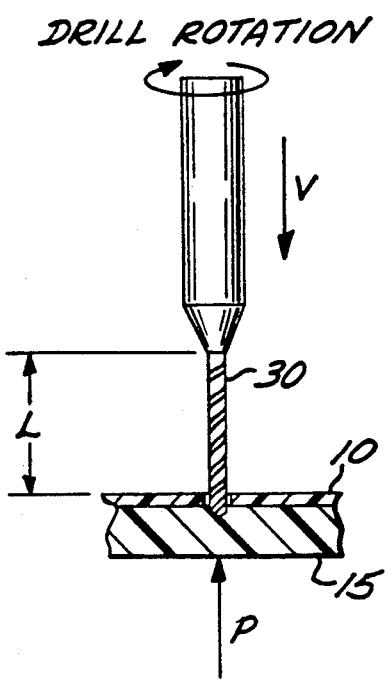
FIG. 2A illustrates the drilling of a printed circuit board with a very small diameter drill employing an entry overlay sheet in accordance with the invention.

To prevent lateral deflection of the drill tip, an entry overlay sheet 10 in accordance with the invention is employed to immobilize the drill tip's lateral movement as shown in FIG. 2A. The entry overlay sheet 10 should also be fabricated from a material which offers minimal resistance to the drill motion in the direction of the hole. Now, with the drill tip lateral motion immobilized, the drill 30 can be modeled as a slender column 31' having both ends 32' and 33' fixed laterally, and instantaneously loaded at end 33' with the axial load P, as shown in FIG. 2A. The small diameter drill now bends or buckles in general accordance with the deflection pattern D' shown in FIG. 2B.

Figure 2B:
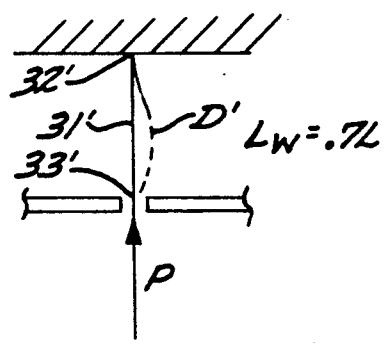
FIG. 2B shows a model of the loading and deflection pattern of the drill bit for this example.

At the moment the drill 30 contacts the hard surface of the printed circuit board for each of the models of FIGS. 1A and 2B, the critical stress level in the drill bit capable of buckling the drill 30 can be calculated by eq. 1.

$$\delta_c = (\pi^2 E)/S^2 \qquad (1)$$

where E = modulus of elasticity of the drill; S = factor dependent on the modeled deflection pattern ($S = L_w/W$; W = drill cross-section modulus). In the model of FIG. 1B, $L_w = 2L$, where L = the length of the slender region of the drill bit 30. In the model of FIG. 2B, $L_w = 0.7L$.

Solving for the critical buckling stress ($\delta_c$) in the drill 30 for both deflection models, it can be shown that the critical buckling stress for the model of FIG. 2B is 8.2 times that of the model of FIG. 1B. Thus, restraining the tip of the drill bit 30 with an entry overlay sheet substantially increases the critical buckling stress by a factor of 8.12. Viewed another way, the drill 30, when using the entry sheet 30, may be considered 8.12 stronger than the rill when used without the sheet.

Figure 3:
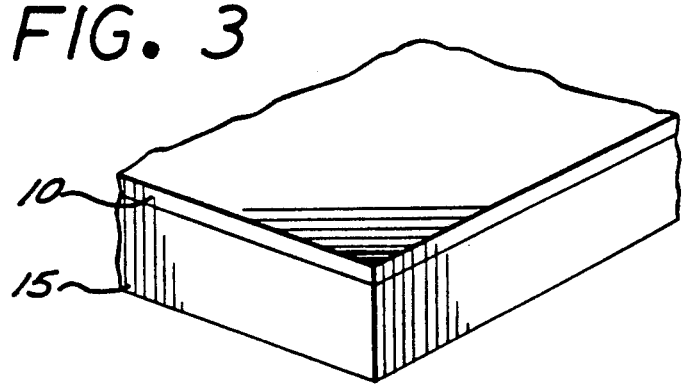
FIG. 3 illustrates an entry overlay sheet in accordance with the invention disposed on top of a printed circuit board in preparation for hole drilling.

According to the present invention, the entry overlay sheet 10 is a homogeneous sheet comprising a polymer material, and is placed on top of the printed circuit board 15 in which small diameter holes are to be drilled, as shown in FIG. 3. The sheet 10 may for some applications be secured to the board 15 by tape or other releasable securing means.

Figure 4:
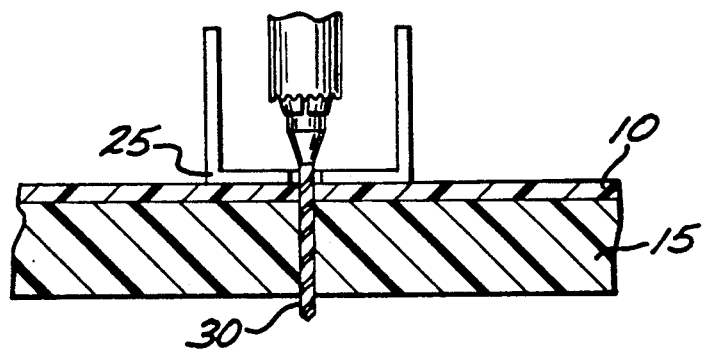
FIG. 4 illustrates a drill spindle drilling through the entry overlay sheet and printed circuit board of FIG. 3 in succession.

FIG. 4 illustrates the method of drilling a printed circuit board employing the entry overlay sheet 10 in accordance with the invention. The small diameter drill 30 is carried by a drilling spindle 20. The spindle 30 typically includes a spindle pressure foot 25. With the entry overlay sheet placed on top of the printed circuit board 15, the spindle 20 and pressure foot 25 are lowered, the pressure foot 25 contacting the sheet 10 and securing it, and the rotating drill 30 is lowered to drill the entry overlay sheet 10 and the board 15 in succession.

According to the present invention, the entry overlay sheet 10 is a homogenous layer comprising a polymer material selected from the thermoset or thermoplastic families of resins which can be fabricated in sheet form. Thin sheets of 5 to 10 thousands of an inch (5 to 10 mils) or less thickness can be made through casting, extruding, calendering or pressing methods currently used to produce commercial films. It is recommended that the thickness of the entry overlay sheet 10 be at least 1.5 times the drill diameter.

Examples of thermoplastic materials believed suitable for fabricating the entry overlay sheet 10 include cellulose triacetate, polyester, polyimid, polyetherimid, and polycarbonate. Polyetherimid is presently a preferred material.

One example of a thermoset material which may be used to fabricate the sheet 10 is epoxy formed into a thin sheet.

The surface finish of the sheet 10 can be either mat or smooth, free of pits, voids or dents. The material comprising the sheet 10 is ideally free of pin holes.

To improve the drilling characteristics of the entry overlay sheet for some applications, the polymer material comprising the sheet may be filled to some degree with fillers, typically fill particles. The filler material is preferably a mineral filler such as talcum powder or other mineral powders. The size of the filler particles should be such that a particle will not significantly obstruct the small diameter drill, and for best performance of the entry overlay sheet should be as small as possible. Thus, the fill particle size should be thirty microns or less, and preferably less than ten microns. Mineral fillers are desirable because they can withstand without decomposition the high temperatures typically used to form the polymer material into the entry overlay sheet. The fill particles should be evenly dispersed in the polymer matrix, assuring homogeneity of the finished entry overlay sheet. By way of example, the addition of talcum powder as a filler to the polymer material in an amount equal to 25% by weight of the polymer material can provide a suitable filled entry overlay sheet which has improved machining characteristics, in that the drill will machine chips of the overlay sheet which are readily removed by vacuum extraction in the conventional manner, instead of relatively long "strings" of the polymer material.

A coating may be applied, to the sheet 10, in some applications to increase the rigidity of the material.

Figure 5:
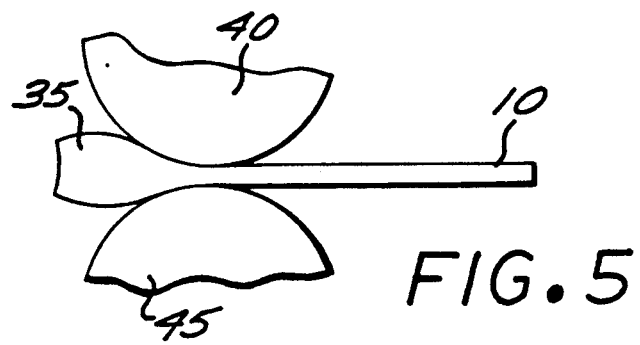
FIG. 5 illustrates a calendering technique for fabricating the entry overlay sheet.

A plastic sheet to be used as the entry overlay sheet 10 may be formed from a liquid bath of resin, to which a filler as described above may have been added by various well-known techniques. To assure homogeneity and flatness of the finished product an extrusion of the melted material through calendering machines is a preferred technique for making the film. Calendering is accomplished by passing the molten material through opposing rollers until a desired thickness is formed. This is generally illustrated in FIG. 5, wherein the molten polymer material 35 is passed through the opposing rollers 40 and 45 to form the sheet 10. The sheets may be passed through an additional set of rollers to apply a mat finish, if desired.

It is understood that the above-described embodiments are merely illustrative of the possible specific embodiments which may represent principles of the present invention. Other arrangements may readily be devised in accordance with these principles by those skilled in the art without departing from the scope of the invention.

What is claimed is:

1. A method for drilling a printed circuit board, comprising the steps of:
    placing an entry overlay sheet on top of said printed circuit board, wherein said entry overlay sheet is a homogenous layer comprising a polymer material having a thickness of about ten thousandths of an inch or smaller, said material selected to have a sufficiently high melting temperature to withstand the heat generated by the drill during the drilling process; and
    drilling through the entry overlay sheet and printed circuit board in succession.

2. The method of claim 1 wherein the drill used to drill the printed circuit board has a diameter of five thousandths of an inch or smaller.

3. The method of claim 1 wherein said polymer material is selected from the family of thermoplastic materials.

4. The method of claim 1 wherein said polymer material is selected from the family of thermoset resins.

5. The method of claim 1 wherein said thickness of said entry overlay sheet is at least 1.5 times the diameter of the drill to be used to drill the holes in the printed circuit board.

6. A method for drilling holes of five thousandths of an inch in diameter or smaller in a printed circuit board, comprising the steps of:
    placing an entry overlay sheet on top of said printed circuit board, wherein said entry overlay sheet is a homogenous layer comprising a polymer material having a thickness of about ten thousandths of an inch or smaller, but at least 1.5 times the diameter of the drill bit to be used, said material selected to have a sufficiently high melting temperature to withstand the heat generated by the drill during the drilling process; and
    drilling through the entry overlay sheet and printed circuit board in succession with a drill bit having a diameter of five thousandths of an inch or smaller.

7. The method of claim 6 wherein said polymer material is selected from the family of thermoplastic materials.

8. The method of claim 6 wherein said polymer material is selected from the family of thermoset resins.

9. A method for drilling a printed circuit board, comprising the steps of:
    placing an entry overlay sheet on top of said printed circuit board, wherein said entry overlay sheet is a homogenous layer comprising a polymer material having a thickness of about ten thousandths of an inch or smaller, and wherein said polymer material is selected from the materials group comprising polyester, cellulose triacetate, polyetherimid, polyphenylene oxide or polycarbonate; and
    drilling through the entry overlay sheet and printed circuit board in succession.

10. A method for drilling a printed circuit board, comprising the steps of:
    placing an entry overlay sheet on top of said printed circuit board, wherein said entry overlay sheet is a homogenous layer of epoxy in sheet form comprising a polymer material having a thickness of about ten thousandths of an inch or smaller; and
    drilling through the entry overlay sheet and printed circuit board in succession.

11. A method for drilling a printed circuit board, comprising the steps of:
    placing an entry overlay sheet on top of said printed circuit board, wherein said entry overlay sheet is a homogenous layer of polyetherimid having a thickness of about ten thousandths of an inch or smaller; and
    drilling through the entry overlay sheet and printed circuit board in succession.

12. A method for drilling a printed circuit board, comprising the steps of:
    placing an entry overlay sheet on top of said printed circuit board, wherein said entry overlay sheet is a homogenous layer comprising a polymer material substantially free of inclusion of any foreign materials and having a thickness of about ten thousandths of an inch or smaller; and
    drilling through the entry overlay sheet and printed circuit board in succession.

13. A method for drilling holes of five thousandths of an inch in diameter or smaller in a printed circuit board, comprising the steps of:
    placing an entry overlay sheet on top of said printed circuit board, wherein said entry overlay sheet is a homogenous layer comprising a polymer material having a thickness of about ten thousandths of an inch or smaller, but at least 1.5 times the diameter of the drill bit to be used, wherein said polymer material is selected from the materials group comprising polyester, cellulose triacetate, polyetherimid, polyphenylene oxide or polycarbonate; and
    drilling through the entry overlay sheet and printed circuit board in succession with a drill bit having a diameter of five thousandths of an inch or smaller.

14. A method for drilling holes of five thousandths of an inch in diameter or smaller in a printed circuit board, comprising the steps of:
    placing an entry overlay sheet on top of said printed circuit board, wherein said entry overlay sheet is a homogenous layer of epoxy in sheet form having a thickness of about ten thousandths of an inch or smaller, but at least 1.5 times the diameter of the drill bit to be used; and
    drilling through the entry overlay sheet and printed circuit board in succession with a drill bit having a diameter of five thousandths of an inch or smaller.

15. A method for drilling holes of five thousandths of an inch in diameter or smaller in a printed circuit board, comprising the steps of:
    placing an entry overlay sheet on top of said printed circuit board, wherein said entry overlay sheet is a homogenous layer comprising a polymer material substantially free of inclusion of any foreign materials and having a thickness of about ten thousandths of an inch or smaller, but at least 1.5 times the diameter of the drill bit to be used; and
    drilling through the entry overlay sheet and printed circuit board in succession with a drill bit having a diameter of five thousandths of an inch or smaller.

16. A method for drilling holes of five thousandths of an inch in diameter or smaller in a printed circuit board, comprising the steps of:
    placing an entry overlay sheet on top of said printed circuit board, wherein said entry overlay sheet is a homogenous layer comprising a polymer material having a thickness of about ten thousandths of an inch or smaller, but at least 1.5 times the diameter of the drill bit to be used, and wherein said entry overlay sheet comprises filler particles of talcum powder having a size of thirty microns or less evenly dispersed in the polymer matrix; and drilling through the entry overlay sheet and printed circuit board in succession with a drill bit having a diameter of five thousandths of an inch or smaller.

* * * * *